United States Patent [19]

Huddleston et al.

[11] Patent Number: 5,498,767
[45] Date of Patent: Mar. 12, 1996

[54] METHOD FOR POSITIONING BOND PADS IN A SEMICONDUCTOR DIE LAYOUT

[75] Inventors: Wyatt A. Huddleston; James J. Casto, both of Austin, Tex.

[73] Assignee: Motorola, Inc., Schumburg, Ill.

[21] Appl. No.: 321,643

[22] Filed: Oct. 11, 1994

[51] Int. Cl.[6] .......................... H01L 21/28; H01L 21/60
[52] U.S. Cl. ............................................ 437/8; 437/204
[58] Field of Search ...................... 437/8, 204; 257/773, 257/786, 220

[56] References Cited

U.S. PATENT DOCUMENTS 5,155,065  10/1992  Schweiss ................................. 437/209
5,245,214  9/1993   Simpson ................................. 257/666

OTHER PUBLICATIONS

W. E. Jahsman; "Lead Frame and Wire Length Limitations to Bond Densification;" Journal of Electronic Packaging; vol. 111, pp. 289–293 (Dec. 1989).

W. Huddleston, et al.; "I.C. Package Inner Lead and Chip Bond Pad Layout Recommendations for Robust . . . " International Elec. Pkg. Conf. Sep. 12–15, '93; vol. 1, pp. 694–702 (1993).

User's Manual for K&S Process Support Tools–Fine Pitch Model by Kulicke & Soffa Industries Inc.; (1993).

*Primary Examiner*—George Fourson
*Assistant Examiner*—David E. Graybill
*Attorney, Agent, or Firm*—Patricia S. Goddard

[57] ABSTRACT

A process for positioning bond pads around a semiconductor die periphery on an octant basis, taking into account both manufacturing and design limitations. The process positions bond pad centers such that the spacing (pitch) increases towards the die corners. The pitch increase is iteratively calculated from an approximated wire angle. The process iteratively recalculates an octant's pad positions until optimum values are converged upon for the approximated wire angle of the cornermost bond pad and for the furthest allowable position for the cornermost bond pad. Once these optimum values are achieved, the resulting bond pad coordinates are stored in memory or a storage media in a format readable by a layout tool being used to design the die (or package). The resulting file is imported into the layout tool, which uses the stored information to physically position bond pads around the die periphery in the die layout.

23 Claims, 5 Drawing Sheets

METHOD FOR POSITIONING BOND PADS IN A SEMICONDUCTOR DIE LAYOUT

FIELD OF THE INVENTION

The present invention generally relates to methods for designing and laying out semiconductor devices, such as integrated circuits, and more specifically to methods for determining positions of bond pads of such devices.

BACKGROUND OF THE INVENTION

One stage of integrated circuit design involves determining where bond pads are to be located on the die or chip. Once functionality and circuit requirements are met in the design, the required number of bond pads to operate the device can be determined. The placement of the required number of bond pads is not a trivial design task. For example, capabilities of manufacturing processes must be taken into account. Moreover, the placement must not unnecessarily increase the final die size. Even in designing devices which are to use wire bonding (as opposed to tape automated bonding or flip chip bonding using conductive bumps), the placement of bond pads can be critical.

Several techniques exist for determining appropriate positions for bond pads in devices which are to be wire bonded around the die periphery. One of the simplest and most prevalent techniques is to simply divide the available perimeter of the semiconductor die by the required number of bond pads. The result is a bond pad configuration having a constant pad pitch (where pitch is the distance from the center of one bond pad to the center of an immediately adjacent pad) around the entire die periphery. A problem with this method is that the constant pad pitch calculated may not be sufficiently large to accommodate bond pad cells. A bond pad cell in a semiconductor design or layout includes not only the actual bond pad metallurgy but other components which designers may include for electrical integrity. These other components may include circuitry to protect from ESD (electrostatic discharge) damage, input buffers, or the like. As a result, the bond pad cell area is usually larger than just the bond pad itself. Accordingly, using the aforementioned constant pitch calculation may result in a bond pad pitch which is smaller than the bond pad cell. In such an instance, the die is said to be "bond pad limited," in that the die size is too small to accommodate all bond pad cells. A solution typically used to avoid the problem of being bond pad limited is to increase the size of the die to accommodate the required number of bond pads and associated cells. However, increasing the die size is an unacceptable solution when the market demands smaller and smaller device sizes to remain competitive.

Another problem in using a constant pad pitch layout is that the "effective pad pitch" or "wire pitch" (the actual pitch between immediately adjacent bonding wires) is not constant around the die periphery, unless all the wires are parallel. Instead, the effective pad pitch (wire pitch) decreases as the die corners are approached because the leads to which the bond pads are eventually bonded are at a larger pitch than the bond pads. This effect is illustrated in FIG. 1. In FIG. 1, P equals the constant bond pad pitch and P' equals the effective pad pitch (wire pitch). As wire bonds 10 approach corners of a semiconductor die 12, an angle θ increases due to an increasing pitch of leads 14. As a result, the effective pad pitch or wire pitch (P') is reduced according to the equation: $P'_x = P * \cos \theta_x$. The effective pad pitch is an important parameter because this distance effects the ability of a wire bonding tool to make bonds without the capillary of the tool disturbing previously made wire bonds. Use of constant pitch bond pad layout may not lead to a layout suitable for manufacturing if the effective pad pitch (wire pitch) becomes too small.

A proposed alternative has been to use a first order approximation of a constant effective pad pitch to determine the location of the bond pads, rather than use a constant pad pitch. This has been proposed using either of two different methods. A first method is termed a "radial layout," while a second method is termed an "exponential layout." Both methods are described in, "I.C. Package Inner Lead and Chip Bond Pad Layout Recommendations for Robust Package Manufacturing," by Wyatt Huddleston et al., 1993 International Electronics Packaging Conference Proceedings, Sep. 12–15, 1994, p. 694–702. In the radial layout, the idea is to define the bond pad locations such that the wire pitch is equal all around the die. This is achieved by assuming that the final wire bonds will be equally arrayed from θ=−45° to θ=0° back to θ=45° along each side of the die. This is usually the case in most high lead count QFP (quad flat pack) packages. In using a constant wire pitch, it follows that the pad pitch is increased from a minimum at the die centerlines to a maximum at the corners since the wire pitch is governed by the equation $P'_x = P * \cos \theta_x$, where $\theta_x$ increases from 0° at the die centerlines to about 45° at the die corners. Predicting the positions of the pads for this type of layout requires iterative calculations. Primary inputs to these equations are the lead count and desired die size and the outputs are bond pad positions and resulting wire pitch. The advantage of the radial layout is that the effective wire pitch (wire pitch) approaches a constant value. This results in more uniform wire distribution, and hence, a more uniform wire bond process.

In the exponential layout, the lead frame design is also accounted for in determining the bond pad layout. Whereas in the radial concept the angle between the wires and a line perpendicular to the die edge was assumed to range from 0° at the die centerline to 45° at the die corners, the exponential approach does not make this assumption. The wires may range up to a value less than or greater than 45°, depending on the actual position of the second bonds (i.e. the bond to the lead frame). In the exponential layout, the pads are positioned to create a constant effective pad pitch (wire pitch) taking into account the actual position of the second bond, whereas in the radial layout the second bond position is ignored. The exponential pitch derives its name from the attribute that the resultant pad pitch asymptotically approaches the pitch of the lead tips and follows an exponential curve (with the exponent<1). For this exponential layout, the bond pad pitch is incrementally increased along the die edge so as to maintain a constant wire pitch, but at a different rate than with the radial layout method. As can be ascertained from the above descriptions, the exponential pitch pad layout relies upon knowing the lead tip layout and conversely the lead tip layout relies on the pad layout. Hence, not only do the bond pad locations result from an iterative calculation, the lead tip positions also result from an iterative process. This method requires a concurrent design methodology as both the bond pad and the inner lead tips are codependent.

While each of the radial and exponential layouts provide advances over constant pad pitch layouts, both have problems. The exponential layout method requires knowledge of many variables: the total bond pad count, the die width, the die length, a corner gap of the die (defined later), a street distance of the die (also defined later), the minimum lead tip width, the minimum space from lead tip to lead tip, the tie bar width, the minimum distance between the tie bar and the cornermost lead, and the distance from the lead tip to the point of the second bond (i.e. the bond to the lead). Knowledge of all these variables may be available if the die is to be packaged in an existing package design, but in many instances a new package design is needed or desired, in which case some of these variables are unknown. The radial layout requires the use of only five variables: the total bond pad count, the die width, the die length, a corner gap of the die (defined later), and a street distance of the die (also defined later). As a consequence of requiring fewer variables, the radial layout has a drawback of potentially determining bond pad coordinates which place the pad centers at distances closer than is physically possible. By not accepting the geometric constraints of the bond pad size and cell size, the radial positions could result in overlapped pads. In general, both the radial and exponential layout techniques fail to account for processing limits imposed by manufacturing equipment and design constraints other than pad pitch. Accordingly, a need for a new layout method exists.

DETAILED DESCRIPTION OF THE PREFERRED EMBODIMENT

Generally, the present invention provides an improved method for positioning bond pads in a semiconductor die layout. While in prior art methods the emphasis was usually placed on using a constant pad pitch or a constant wire pitch in determining bond pad positions, the present invention further takes into account manufacturing and geometric design limitations which may be imposed upon bond pad placement, thereby making the operation of wire bonding more manufacturable. Another advantage of the present invention is that the process requires knowledge of a minimum number of variables, all of which are associated with physical aspects of the die being designed. Lead frame or package variables are not necessary. The present invention achieves this advantage through an iterative process designed to achieve a first order approximation of the pad positions which would result in consistent wire-to-wire spacing around the periphery of the die, allowing for restrictions of the minimum pad-to-pad spacing in accordance with the physical design of the bond pads. The wire directions are assumed to be parallel to the lines that the pad centers form with an optimized focal point. The wires at the die corners are assumed to be approximately in line with the direction of the die diagonals.

In a preferred embodiment, the present invention is implemented with a combination of software and hardware. Software may be written to perform the iterative calculations and comparisons involved in the present invention. An example of such a program is attached herewith in Appendices A and B, where Appendix A includes a source file for the main code and Appendix B includes a header file for definition and function prototypes. Although the Appendix program is written in "C" programming language, such a program may be written in other programming languages, such as BASIC, FORTRAN, APL, PASCAL, COBOL, PL1, C, C++, LISP, SMALLTALK, MODULA-2, ADA, ASSEMBLY, and the like. The software is executed in conjunction with a central processing unit with associated memory (read-only memory and/or random access memory). The results of executing the software program are then stored in memory in a format which is readable to the CAD (computer-aided design) tool used for the die layout, for example in ASCII (American Standard for Computer Information Interchange) format. The stored file may then be imported into the CAD tool application, at which time the information in the stored file is used to physically position bond pads (using a coordinate system) in a layout of a semiconductor die. It is noted that in the proper format, the file containing the bond pad information can also be read by a CAD tool used for package design layout. The bond pad information can be used at the package design phase to analyze the final wire arrangement prior to die fabrication.

Figures 1, 2:
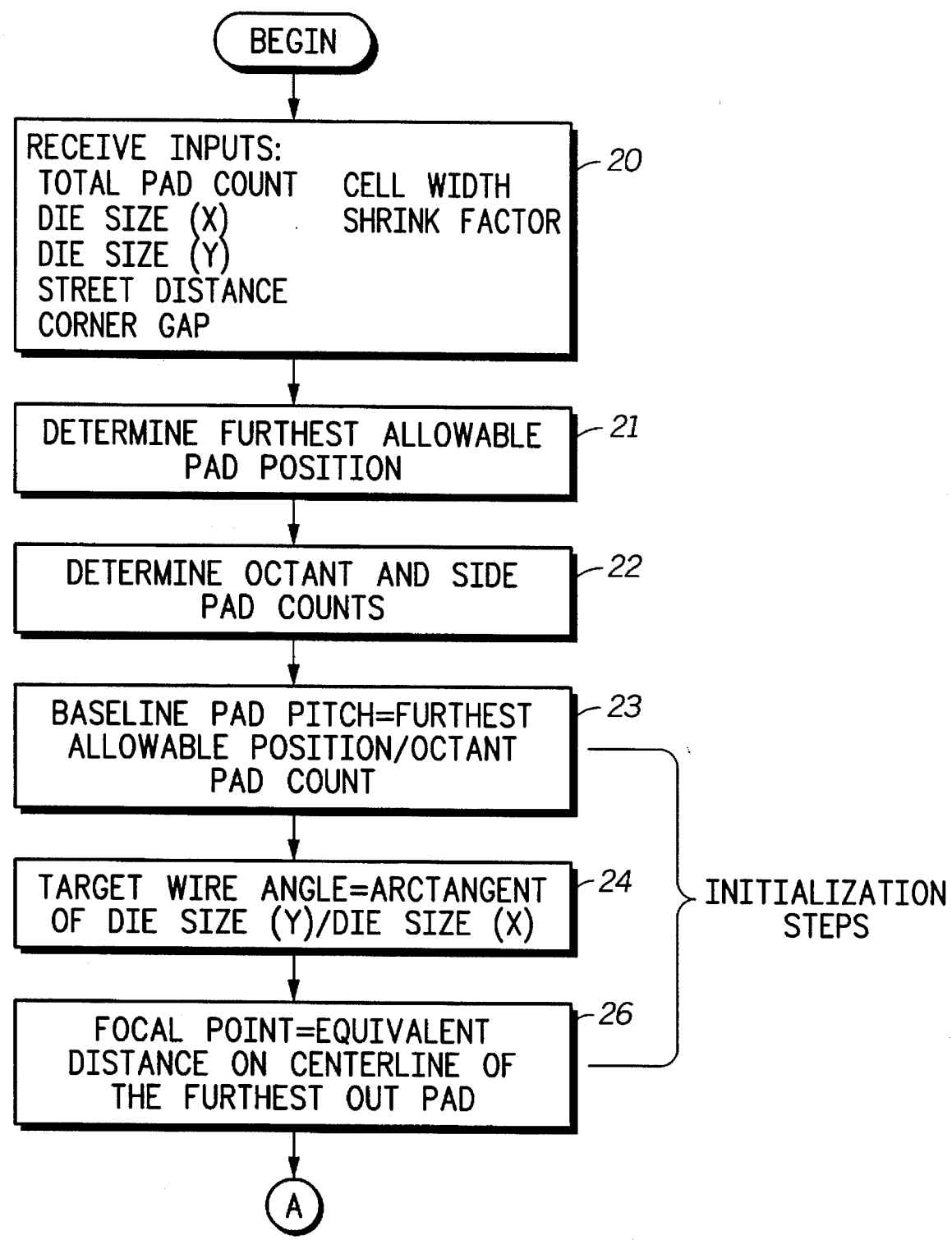
FIG. 2, broken into two segments 2-1 and 2-2, is a flow chart outlining a method in accordance with the present invention for determining and positioning bond pads on a semiconductor die.
Figure 2:
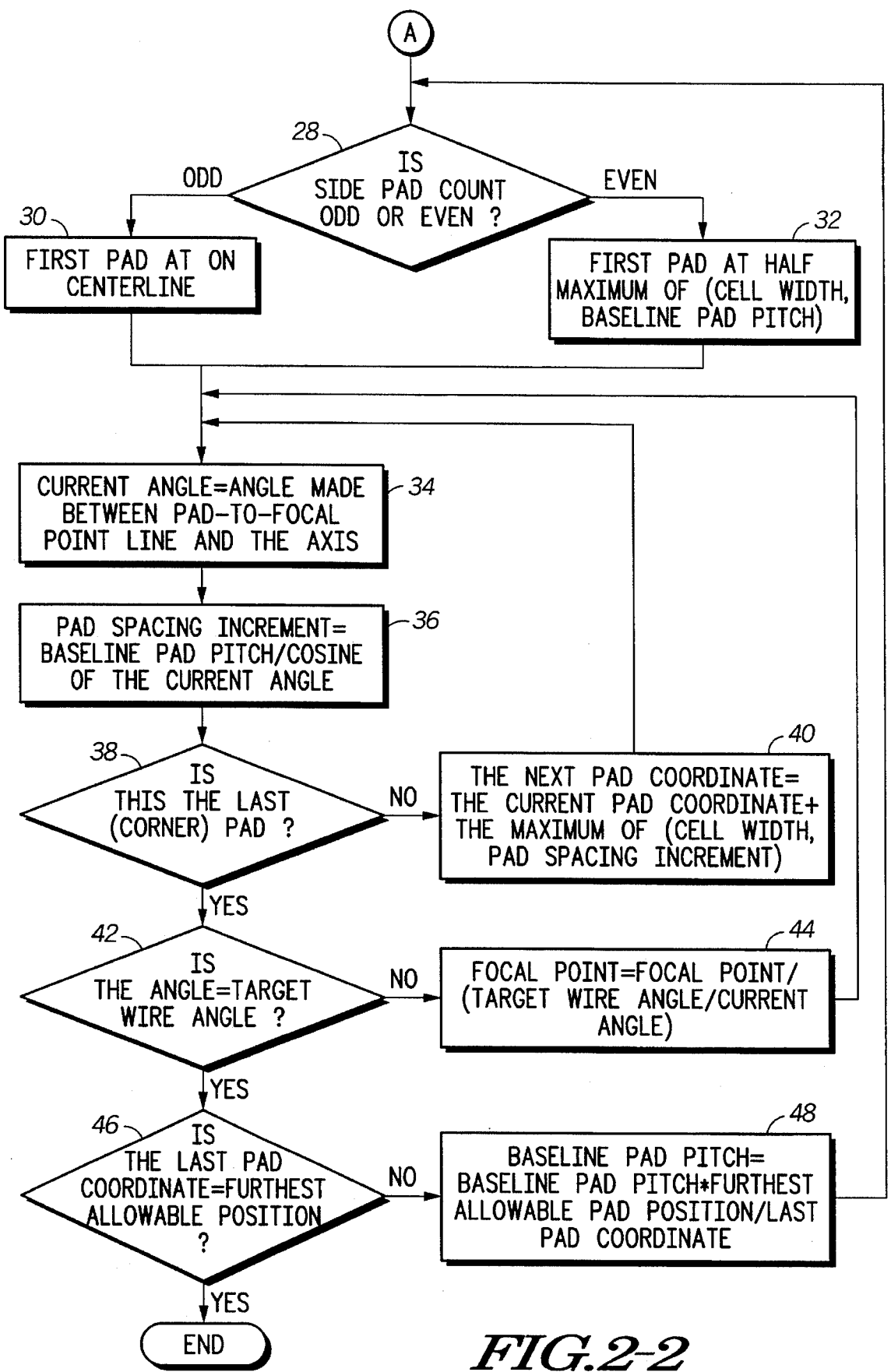

FIG. 2 is a flow chart outlining steps for positioning bond pads in a semiconductor layout in accordance with the present invention. The flow chart is broken into two segments, 2-1 and 2-2, wherein 2-2 is a continuation of 2-1. FIGS. 3–6 illustrate a semiconductor die, and are useful in understanding the various steps outlined in FIG. 2. While the procedure outlined in FIG. 2 is quite detailed, it is noted that not all of these steps are required in practicing the present invention. Furthermore, there may be more than one method of practicing individual steps or achieving a particular result within the outlined procedure.

Figure 4:
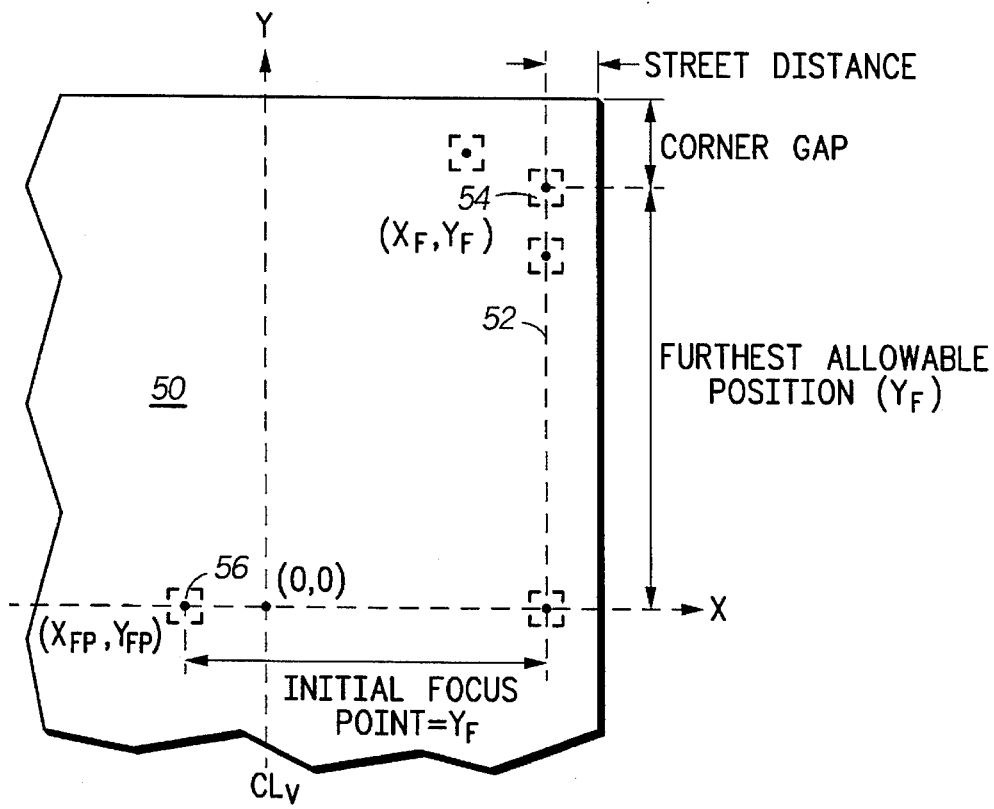

A first step 20 is an input step wherein a number of die variables are set. A first input variable is a "Total Pad Count," which is the total number of bond pads to be positioned around the die. The Total Pad Count is a fixed number which is typically established near the end of a die design cycle based upon the performance requirements of the die. A second and a third input variable are the die width and die length, respectively, which for simplicity will hereinafter be referred to as "Die Size (X)" and "Die Size (Y)." For purposes of this discussion, Die Size (Y) will be the measured distance of the die's longest side and Die Size (X) will be the measured distance of the die's shortest side. Again, Die Size (X) and Die Size (Y) will be determined by space requirements of the die's circuitry. A fourth input variable is the die's "Street Distance." As shown in FIG. 4, a semiconductor die 50 has a Street Distance which is the distance from the edge of the die to a centerline 52 through a row of bond pads located along that edge. The Street Distance is usually determined from manufacturing limitations imposed by assembly operations, such as sawing or dicing the die from a wafer. A fifth input variable is a "Corner Gap." The Corner Gap is the distance from the center of the furthest bond pad along an edge (i.e. the closest pad to a die corner) to the adjacent or neighboring edge, as shown in FIG. 4. The Corner Gap is typically larger than the Street Distance to avoid interference between the furthest or cornermost pad along one edge and the furthest or cornermost pad along an adjacent edge.

Other inputs which may be used in practicing the invention include a "Cell Width" and a "Shrink Factor." Cell Width refers to the effective width of a bond pad as it includes associated bond pad circuitry, such as input buffers, ESD (electrostatic discharge circuitry), and the like. The actual bond pad and accompanying circuitry together form a bond pad cell. The area of the circuitry beyond the actual bond pad metal dimensions will affect how close bond pads can be placed next to one another. Accordingly, knowledge of the cell dimension (particularly cell width) is useful in determining bond pad positions in the present invention. A shrink factor is an amount by which physical dimensions will be reduced in a particular die version from the originally designed dimensions, e.g. a 35% shrink of the original die. Original die designs are typically shrunk as manufacturing technology improves in order to reduce the overall die size, making the die more marketable and cost effective. A desired shrink factor can be input, and the bond pad coordinates achieved as a result of running the steps shown in FIG. 2 will be adjusted according to the Shrink Factor.

After the inputs are received, select input values are used to determine other values useful for determining bond pad positions. One such value, the Furthest Allowable Pad Position, is determined in a step 21 of FIG. 2 (segment 2-1). The Furthest Allowable Bond Pad Position is the closest pad position to the corner of the die. The Street Distance and Corner Gap as input in step 20 are used to determine the coordinate position of the Furthest Allowable Pad Position for a bond pad. As FIG. 4 indicates, the coordinates of a furthest allowable bond pad 54, as measured from the center of a die 50, would be $(X_F, Y_F)$, where $X_F=\frac{1}{2}$ Die Size (X)–Street Distance and $Y_F=\frac{1}{2}$ Die Size (Y)– Corner Gap. If the Furthest Allowable Pad Position is already known, that value can be used as an input in place of the Street Distance and Corner Gap values in step 20, and step 21 may be eliminated.

Figure 1:
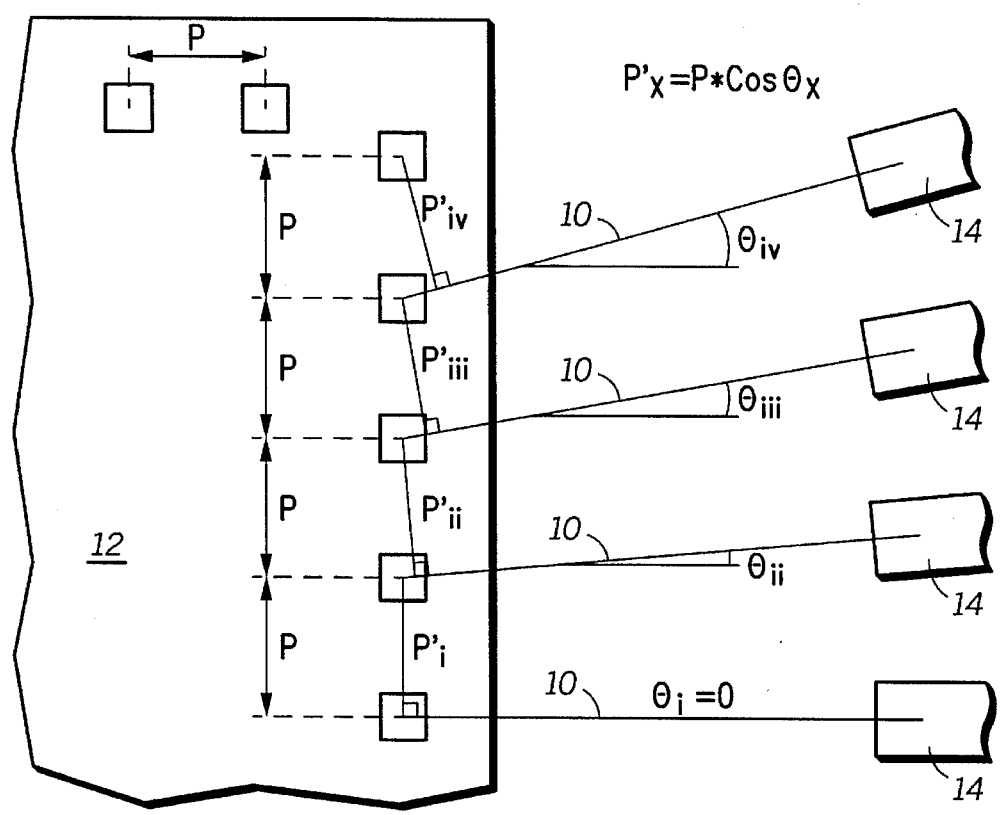
FIG. 1 depicts a corner portion of a wire-bonded semiconductor die and a prior art method for determining bond pad positions on the die.
Figure 3:
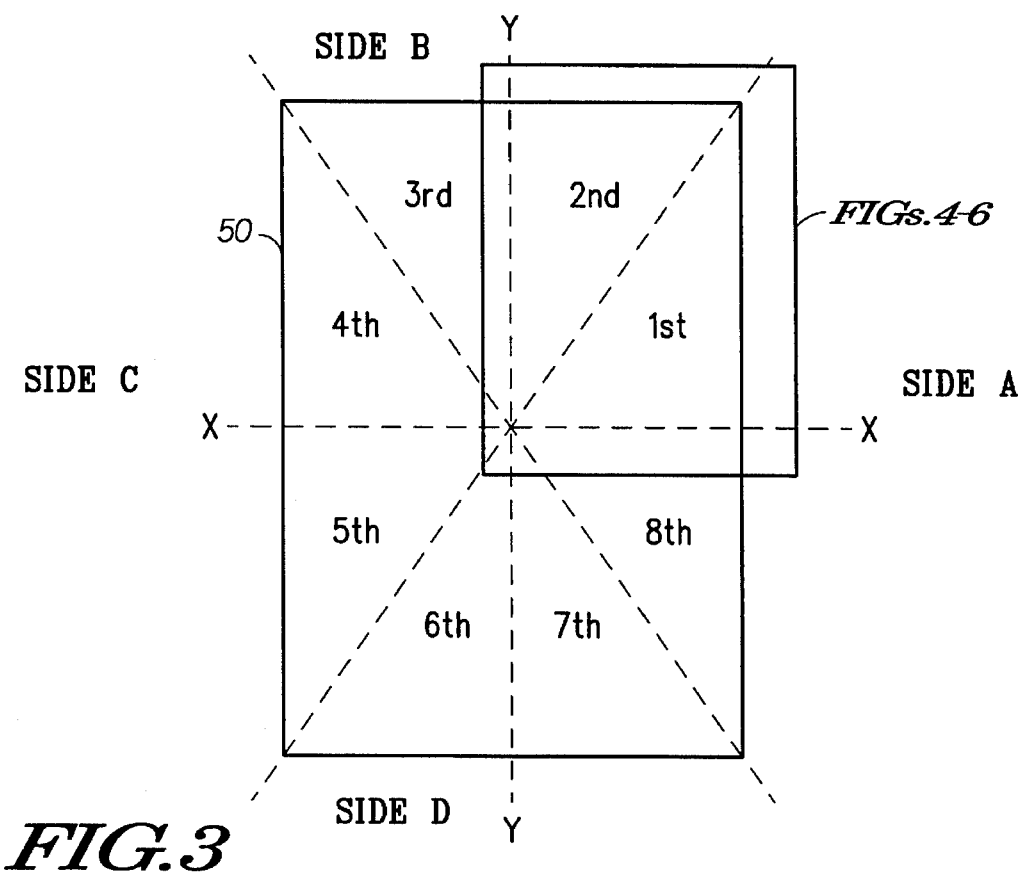
FIGS. 3–6 illustrate a semiconductor die, or a portion thereof, and are used to explain the method outlined in FIG. 2.

Other values useful for determining bond pad positions in accordance with the present invention are the Octant Pad Count(s)s and Side Pad Count(s). Both of these values are determined in a step 22, shown in FIG. 2 (segment 2-1). In bond pad layout, designers typically work in octants to take advantage of the symmetry of the die. Likewise, for purposes of practicing the present invention, working by octants is advantageous. As illustrated in FIG. 3, a semiconductor die 50 can be segmented into eight octants, all of which are identical in physical dimensions, differing only in orientation. By determining the bond pad positions in one octant, the bond pad positions for at least three other octants can be determined mathematically by a mirroring the pad coordinates of the first octant. If the die is perfectly square, bond pads from one octant can be mirrored in all of the remaining seven remaining octants. A further explanation of this mirroring process is explained subsequently. The Octant Pad Count is determined from the Side Pad Count as discussed below.

Both the side and octant pad counts can be determined from the input values received in step 20, as follows. In the case of a square die, the Side Pad Count is easily calculated as the Total Pad Count divided by four. However, in the case of a rectangular die, the sides may have different pad counts. Referring to FIG. 3, side A and C will have one pad count, while side B and D will have another pad count. The pad count of the sides can be calculated as follows:

Total Pad Count=$Side^A + Side^B + Side^C + Side^D$; and $Side^{A,C}/Side^{B,C}$=Die Size (Y)/Die Size (X);

wherein $Side^{A,C}$ is the side pad count for the vertical sides, and $Side^{B,C}$ is the side pad count for the horizontal sides. The Total Pad Count, Die Size (X) and Die Size (Y), are inputs from step 20. Upon solving the above two equations simultaneously, the two different Side Pad Counts are determined. Algebraic results of fractional pad counts may be rounded up or down as necessary. From the Side Pad Counts, the Octant Pad Counts are determined by simply dividing each Side Pad Count by 2. Odd Side Pad Counts can be handled in a variety of ways. One way to determine Octant Pad Counts when the side pad count is odd is demonstrated as follows. If the $Side^{A,C}$ Pad Count is odd, the pad counts for the 1st and 5th octants are rounded up and the difference is assigned to the 8th and 4th octants, respectively. If the $Side^{B,D}$ Pad Count is odd, the pad counts for the 2nd and 6th octants are rounded up and the difference is assigned to the 3rd and 7th octants, respectively.

After Side and Octant Pad Counts are determined, a series of initializations steps occur as indicated in FIG. 2 (segment 2-1). A first initialization step 23 initializes a variable called "Baseline Pad Pitch." The Baseline Pad Pitch will be used to position bond pads in a first iteration of the method outlined in FIG. 2. In accordance with the present invention, Baseline Pad Pitch is initially set to a constant pad pitch, and thus may be set to equal the distance around the die (the die perimeter) divided by the Total Pad Count. However, in accordance with the present invention, bond pad layout and design is preferably accomplished on an octant-by-octant basis. As a result of working on an octant-by-octant basis, the pad count used for determining the Baseline Pad Pitch is preferably a pad count for the current octant in which pad positions are being determined, rather than the total die perimeter (i.e. the Octant Pad Count). Similarly, in calculating a Baseline Pad Pitch (which is initially a constant pad pitch), the distance used should be an octant-based distance rather than the entire die perimeter. Moreover, it is preferred that the distance used to determine the Baseline Pad Pitch is the distance from the Furthest Allowable Pad Position (determined in step 21) to a center axis of the die. For the purposes of the present discussion, the method of FIG. 2 will be described first in reference to positioning bond pads in the 1st octant of die 50 as shown in FIG. 3. The 1st octant is shown in an exploded view in FIG. 4, which may be referenced to understand how the Baseline Pad Pitch is calculated. The centerlines or axes of die 50 are illustrated as an X-axis and a Y-axis. The position of furthest allowable bond pad 54 may be expressed as coordinates $(X_F, Y_F)$, as calculated above. Thus, the distance from the furthest allowable bond pad 54 to the X-axis for the purpose of determining the Baseline Pad Pitch is $Y_F$.

A second initialization step 24, shown in FIG. 2 (segment 2-1), sets a variable called "Target Wire Angle." Due to the spacing differences between bond pads and leads (bond pads can be placed closer together than leads typically can), wire bonds fan out from the die perimeter to the leads in a radial pattern. From a manufacturing perspective, it is desirable to have the angle of each wire bond as it extends from the die, as measured from a focal point, the same as the angle of the lead to which the wire is bonded. Stated otherwise, the line of the wire and a line drawn from the lead to a focal point are preferably line-on-line. Having the wire and lead line-on-line is preferred because it establishes the largest window possible for second bond (the bond to the lead) misalignment in the lateral direction. As the difference in angle between the wire centerline and the lead centerline increases the process robustness decreases due to greater possibility of bond misalignment. Also, because the wire is bonded at a distance from the lead tip, as the angle difference between the wire centerline and the lead centerline increases there is a potential that a wire could cross over an adjacent lead, a condition which is unallowable.

Figure 5:
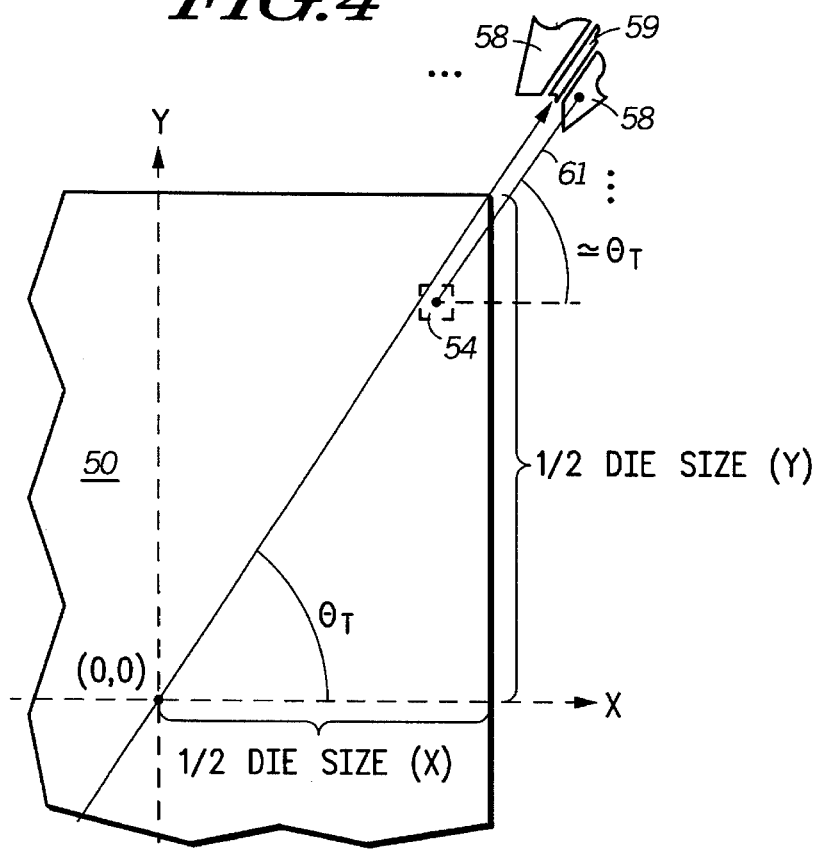

To minimize the angle difference between the wire centerline and the lead centerline, the present invention determines a Target Wire Angle (as measured from a focal point of the last wire in the octant—i.e. the wire of the furthest or cornermost pad—). A comparison of the Target Wire Angle to an angle between the furthest or cornermost pad (as determined from performing the steps of FIG. 2) and the die centerline (as measured from a focal point) is performed to make sure the difference between these two angle is not too great. Thus, a Target Wire Angle must be set. In accordance with the present invention, this Target Wire Angle is set to:

Target Wire Angle=arc tangent {Die Size (Y)/Die Size (X)};

and is depicted in FIG. 5. As illustrated, the Target Wire Angle ($\theta_T$) is set to equal the central angle of the 1st octant, or in other words the angle between the X-axis centerline of the die and a line drawn from the center of the die to the die corner between the 1st and 2nd octants. In accordance with the present invention, this angle is used as the Target Wire Angle of the furthest bond pad because it closely approximates the actual wire angle of the furthest bond in an ideal design, particularly in a ceramic or plastic QFP (Quad Flat Package) design. In accordance with the present invention, an assumption is made, which is especially true in a QFP design, that a cornermost lead 58 will have approximately the same angle as a corner tie bar 59, as shown in FIG. 5. A further assumption is made that a wire bond 61 from the cornermost bond pad to the cornermost lead will have an angle approximately equal to the diagonal of the die, as indicated in FIG. 5. Thus, in order to achieve the ideal situation that the wire angle equal the lead angle at the furthest bond pad, a "Target Wire Angle" for this pad is set equal to the angle of the die diagonal.

A third initialization step 26, shown in FIG. 2 (segment 2-1) sets a variable called a "Focal Point." The Focal Point is used as a reference point to measure angles between adjacent bond pads, and is used to approximate the angles of the bond wires as the wire extends beyond the die edge. Prior art bond pad layouts have also utilized focal points in determining where to position bond pads about the die periphery; however, most prior art focal points are located at the die center or at the intersection of the 45° lines from the die corners. In accordance with the present invention, the Focal Point is along a centerline of the die, but is not necessarily at the precise center of the die. Moreover, the Focal Point is not necessarily the same point for each of the octants, although it is calculated in the same manner for each octant. In initialization step 26, the Focal Point for the 1st octant is initially set to be a point on the X-axis corresponding to the y-coordinate of the furthest allowable bond pad. As depicted in FIG. 4, the furthest allowable bond pad 54 has a coordinate ($X_F$, $Y_F$). A focal point 56 is initially set along the X-axis at a distance equal to $Y_F$ from centerline 52 of the bond pads in the 1st octant. Mathematically, the x-coordinate of the initial Focal Point is set to: $X_{FP}$=½*Die Size (Y)–Street Distance–$Y_F$. Being along the X-axis, the y-coordinate of the initial Focal Point is zero. Initialization step 26 for the Focal Point in accordance with one embodiment of the invention sets the initial Focal Point to be that point which creates a 45° angle between the X-axis and the furthest allowable bond pad. Other initial focal point values may be used in accordance with the present invention, however, the number of iterations used to determine the final bond pad placements is kept to a small number by using the initial Focal Point set forth above.

Figure 6:
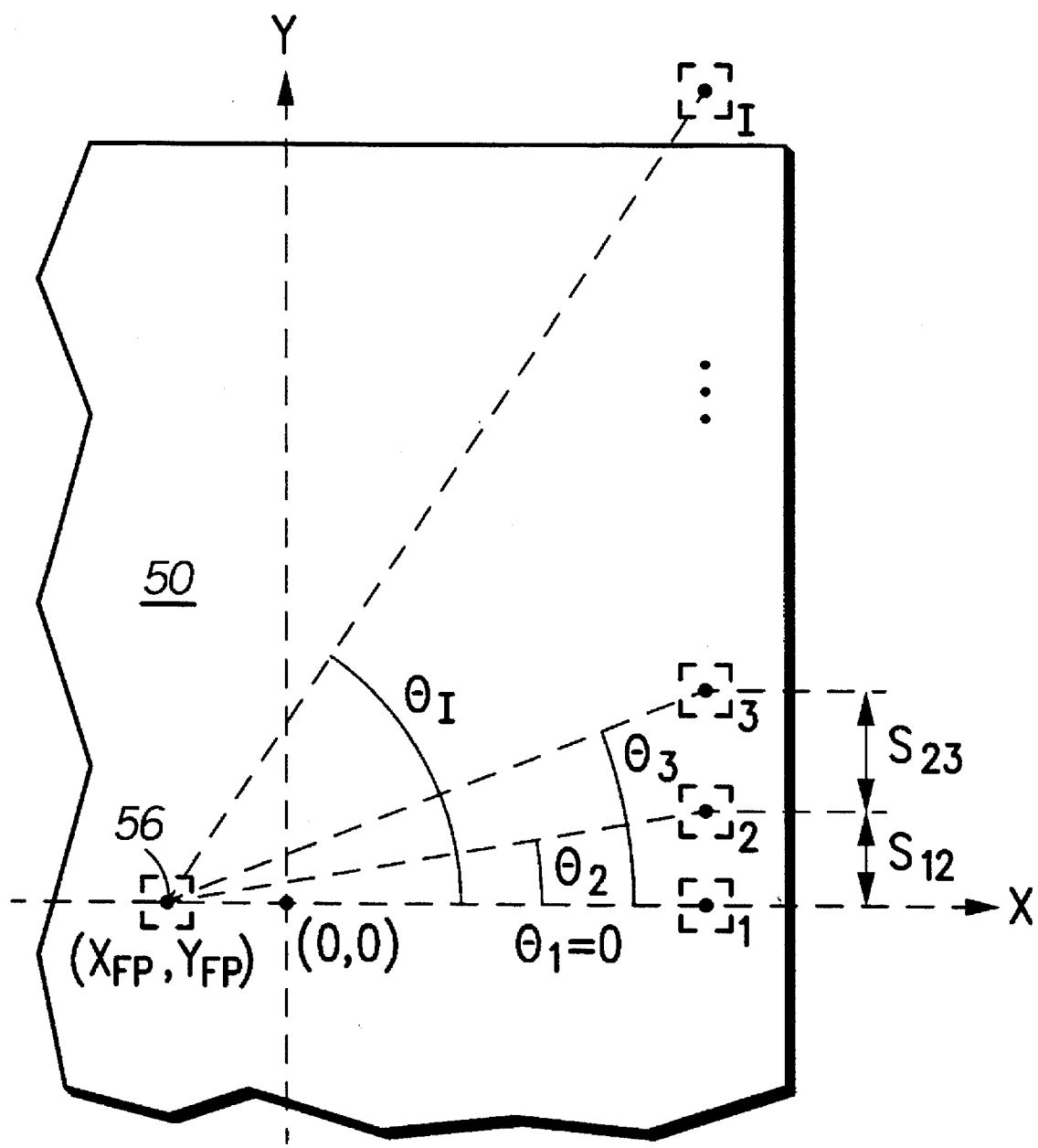

After the Baseline Pad Pitch, the Target Wire Angle, and the Focal Point are initialized in steps 23, 24, and 26, determination of the bond pad positions within the 1st octant begins. The position of the first bond pad will depend on whether there is an odd or even number of bond pads to be positioned on the side of the die. Whether the Side Pad Count is odd or even is determined in a decision step 28 of the method outlined in FIG. 2 (segment 2-2), and is preferably accomplished using a known subroutine for determining the character of a number. If an odd number of pads is included along the side, a step 30 sets the first bond pad position for the octant directly on the die centerline or X-axis. Thus, the first bond pad has a x-coordinate of x=½*Die Size (Y)–Street Distance, and a y-coordinate of Y=0, as illustrated in FIG. 6. Note that for the purpose of positioning pads in the 1st octant, the x-coordinate for all the pads will be the same. Accordingly, only the y-coordinates are subsequently discussed. If the side pad count is even, the first bond pad position is set to have a y-coordinate of ½*Baseline Pad Pitch. (Note that ½ of the Baseline Pad Pitch is used because the other ½ of the Baseline Pad Pitch will be used to position the first bond pad in the 8th octant, resulting in the Baseline Pad Pitch between these two pads.) Alternatively, if the octant pad count is even the first bond pad position may be set to be the greater of either a) ½*Baseline Pad Pitch; or b) ½*Cell Width, as indicated by a step 32 in FIG. 2 (segment 2-2). If a Cell Width is specified, a bond pad should not be positioned next to an adjacent bond pad at a distance less than the Cell Width in order to accommodate the bond pad cell dimensions. Accordingly, step 32 would compare the Baseline Pad Pitch to the Cell Width and set the y-coordinate of the first pad position to ½ the greater of the two.

After setting the position of the first bond pad in either step 30 or step 32, a next step is a calculation step 34 which calculates a "Current Angle." The Current Angle is the angle between the X-axis and a line drawn between the bond pad last positioned and the Focal Point. Mathematically, the Current Angle may be calculated as:

$\theta_i$=arc tangent ($S_{i-1,i}$/distance from bond pad centerline to Focal Point); where $S_{i-1,i}$ is the distance between the adjacent bond pad centers (e.g. $S_{12}$ is the distance between the centers of the 1st and 2nd bond pads). Recall that the initial Focal Point was set in step 26, and was determined to be equal to $Y_F$ (See FIG. 4). Thus, for at least the first iteration, the Current Angle may be calculated as: $\theta_i$=arc tangent ($S_{i-1,i}/Y_F$). A clearer understanding of which angle is being measured, and how the angle is calculated, is shown in FIG. 6. In step 30 or 32, the first bond pad position was set. According to FIG. 6, the first bond pad was centered on the X-axis, leaving the Current Angle—the angle ($\theta_1$) between the X-axis and line drawn from the first bond pad to the Focal Point—equal to 0°. Note that if the Side Pad Count were even, $\theta_1$ would be greater than 0°, and could be calculated as $\theta_1$=arc tangent ($S_{01}/Y_F$).

After determining the Current Angle, a Pad Spacing Increment is determined in step 36. The Pad Spacing Increment is the spacing or distance from the last or current bond pad to the next bond pad. The Pad Spacing Increment is calculated to equal the Baseline Pad Pitch divided by the cosine of the Current Angle. As an example, the Pad Spacing Increment between the first and a second bond pad ($S_{12}$ as illustrated in FIG. 6) would equal the Baseline Pad Pitch divided by cosine $\theta_1$. This equation is used to determine the Pad Spacing Increment so that the pad spacing is increased to maintain the same wire-to-wire pitch. This layout approach assumes the wire angle will be the same as the current angle. Therefore, the pitch is increased in proportion to the cosine of the angle.

Before using the Pad Sparing Increment to actually set the coordinate position for the next pad, it is first determined whether or not the current pad is the final pad to be placed in the octant. This is accomplished in a decision step 38. For purposes of the illustration and description, the final pad position has been designated the Ith position (wherein I equals the octant pad count). If the current pad is the Ith (final) pad of the octant, there is no need to continue determining bond pad positions. If the position of the Ith pad has not yet been determined, then the position of the next pad is set according to a calculation step 40. In calculation step 40, the position of the next pad is set to equal the current pad position plus the Pad Spacing Increment, as determined in step 36. Alternatively, if a Cell Width is available, the next pad position can be set to either a) the current pad coordinate plus the Pad Spacing Increment, or b) the current pad coordinate plus the Cell Width, whichever is greater. In the latter instance, the next pad position is thus guaranteed not to overlap circuitry associated with adjacent bond pads. As illustrated in FIG. 6, the second bond pad is positioned a distance equal to the Pad Spacing Increment ($S_{12}$) above the first bond pad. In FIG. 6, the first bond pad has a y-coordinate of zero because the Side Pad Count for discussion purposes was set to be odd, resulting in a y-coordinate of $S_{12}$ for the second bond pad.

After the second bond pad coordinates are established, steps 34, 36, and 38 are repeated using the second bond pad as the current pad. For example in step 34, the Current Angle is calculated as the angle between the X-axis and a line drawn between the second bond pad center and the Focal Point (illustrated in FIG. 6 as $\theta_2$). In step 36, the Pad Spacing Increment (now the spacing increment between the second and third bond pad or $S_{23}$) is then calculated using $\theta_2$. If the second bond pad is not the final bond pad as determined in step 38, then step 40 sets the y-coordinate of the third bond pad position equal to the y-coordinate of the second pad plus $S_{23}$ or the Cell Width, whichever is greater.

Steps 34, 36, 38, and 40 are repeated for the third bond pad, fourth bond pad, etc., up to the Ith bond pad of the 1st octant. After setting the position of the Ith bond pad in step 40, the Current Angle and Pad Spacing Increment are again calculated in steps 34 and 36. As a result, the Current Angle ($\theta_I$) is now the angle between the X-axis and a line drawn between the Focal Point and the Ith bond pad, as illustrated in FIG. 6. In decision step 38, the result will be now be "Yes" since the Ith pad is the last or corner pad, and the method proceeds to another decision step 42, as indicated in FIG. 2 (segment 2-2). In step 42, the Current Angle ($\theta_I$) is compared to the Target Wire Angle, as set in step 24. If the Current Angle is not equal to the Target Wire Angle (or not within a specified range surrounding the Target Wire Angle), then the process proceeds to step 44. In step 44, the Focal Point is reset to a better position than was originally set in step 26. In step 26, the Focal Point was initialized to a point on the X-axis corresponding to the y-coordinate of the furthest bond pad. The initial Focal Point value was set on the basis that the die was square (i.e. used a 45° angle). However, in the case of a rectangular die, this assumption fails to produce the desired result of having $\theta_I$ (the angle to the furthest bond pad) equal to the Target Wire Angle. Accordingly, an adjustment is made to the Focal Point. All of the bond pad positions for the current octant are determined again using the new Focal Point. The adjustment to the Focal Point is made by dividing the current Focal Point by a ratio of the Target Wire Angle to the Current Angle ($\theta_I$). The ratio of the Target Wire Angle to $\theta_I$ represents the proportional error between $\theta_I$ and the Target Wire Angle, so the Focal Point is adjusted proportionately in step 44.

After resetting the Focal Point, the bond pad positions of the second through the Ith bond pads are recalculated according to steps 34, 36, 38, and 40 as described above. (Note that there is no need to again determine the position of the first bond pad since its position was not determined as a function of the Focal Point). After again reaching the Ith pad position, the Current Angle ($\theta_I$) is compared to the Target Wire Angle in step 42. If $\theta_I$ does not equal or fall within the prescribed range surrounding the Target Wire Angle, the Focal Point is again reset. Steps 24, 36, 38, 40, 42, and 44 are then repeated until $\theta_I$ finally falls within the prescribed range.

Once the Current Angle is sufficiently close to the Target Wire Angle in step 42, the process proceeds to a step 46, shown in FIG. 2 (segment 2-2). In step 46, the Ith bond pad position is compared to the Furthest Allowable Pad Position as determined in step 21. Step 46 is intended to make sure that the maximum amount of die space available for bond pads has been utilized. If the Ith bond pad position is not equal to the position of the furthest allowable bond pad (or within a prescribed range surrounding the furthest allowable bond pad position), then the Baseline Pad Pitch is reset according to step 48. In step 48, the Baseline Pad Pitch is reset proportionately to the amount the Ith bond pad and furthest allowable bond pad positions are different from one another. In other words, the Baseline Pad Pitch is reset to equal the original (or current) Baseline Pad Pitch multiplied by a ratio of the Furthest Allowable Pad Position divided by the Ith bond pad position (using only the y-coordinates of the positions since the x-coordinates are equal in the 1st octant).

After resetting the Baseline Pad Pitch, the first through the Ith bond pad positions are recalculated using steps 28, 30, 32, 34, 36, 38, 40, 42, and 44 as necessary from the discussion above. (Note that the first bond pad position must be recalculated after resetting the Baseline Pad Pitch because the first bond pad position is dependent on the Baseline Pad Pitch if the number of pads along the side is even.) After recalculating all bond pad positions within the 1st octant, the coordinates of the Ith bond pad and the furthest allowable bond pad are again compared in step 46. If the Ith bond pad is not within the prescribed range around the Furthest Allowable Pad Position, the Baseline Pad Pitch is again reset (using the current baseline pitch in the equation for resetting). Steps 28, 30, 32, 34, 36, 38, 40, 42, 44, 46, and 48 are repeated as necessary until the Ith bond position finally falls within the prescribed range surrounding the Furthest Allowable Pad Position.

After an affirmative result in achieved in step 46, the bond pad positions as determined by the most recent iteration of steps 28, 30, 32, 34, 36, 38, 40, 42, 44, 46, and 48 are set as the final bond pad positions for the pads in the 1st octant of the die. These pad positions are then stored in memory or written to a storage media (e.g. a hard disk) in ASCII format, or other format readable by a CAD layout tool which can use the information.

After the bond pad positions are finalized for the 1st octant, the bond pad positions for the remaining octants are determined. If the pad count in each of the eight octants is the same, this may be achieved by simply performing a mathematical operation on the bond pad coordinates of the 1st octant as shown in the table below.

| OCTANT | COORDINATES | HOW COMPUTED ... |
|---|---|---|
| 1st | (X, Y) | Process outlined in FIG. 2 |
| 2nd | (Y, X) | Switch coordinates of pads in 1st Octant |
| 3rd | (Y, −X) | Switch coordinates of pads in 1st |

| OCTANT | COORDI-NATES | HOW COMPUTED ... |
| --- | --- | --- |
| | | Octant, and multiply y-coordinate by −1 |
| 4th | (−X, Y) | Use coordinates of pads in 1st Octant, and multiply x-coordinate by −1 |
| 5th | (−X, −Y) | Use coordinates of pads in 1st Octant, and multiply both x-coordinate and y-coordinate by −1 |
| 6th | (−Y, −X) | Switch coordinates of pads in 1st Octant, and multiply both x-coordinate and y-coordinate by −1 |
| 7th | (−Y, X) | Switch coordinates of pads in 1st Octant, and multiply x-coordinate by −1 |
| 8th | (X, −Y) | Use coordinates of pads in 1st Octant, and multiply y-coordinate by −1 |

If the pad count is not equal in all eight octants, then the bond pad coordinates of the 1st octant can only be mirrored into the 4th, 5th, and 8th octants (because only these octants will have an equal Octant Pad Count). The coordinates for the 4th, 5th, and 8th octants can be determined as follows.

| OCTANT | COORDI-NATES | HOW COMPUTED ... |
| --- | --- | --- |
| 1st | $(X_1, Y_1)$ | Process outlined in FIG. 2 |
| 4th | $(-X_1, Y_1)$ | Use coordinates of pads in 1st Octant, and multiply x-coordinate by −1 |
| 5th | $(-X_1, -Y_1)$ | Use coordinates of pads in 1st Octant, and multiply both x-coordinate and y-coordinate by −1 |
| 8th | $(X_1, -Y_1)$ | Use coordinates of pads in 1st Octant, and multiply y-coordinate by −1 |

To determine the bond pad coordinates in the remaining octants, the process outlined in FIG. 2 must again be followed to determine the bond pad positions in these different octants. The process of FIG. 2 is performed once to produce the bond pad coordinates for the 2nd octant of the die. (Note that in performing the process of FIG. 2 for the 2nd octant, the X and Y coordinates for all points are swapped since the bond pads are being placed along a line parallel to the X-axis rather than the Y-axis as in the 1st octant). After performing the steps of FIG. 2 for the 2nd octant, the resulting bond pad coordinates for the 2nd octant may then be manipulated according to the table below to establish the bond pad coordinates in the 3rd, 6th, and 7th octants.

| OCTANT | COORDI-NATES | HOW COMPUTED ... |
| --- | --- | --- |
| 2nd | $(X_2, Y_2)$ | Process outlined in FIG. 2 |
| 3rd | $(-X_2, Y_2)$ | Use coordinates of pads in 2nd Octant, and multiply x-coordinate by −1 |
| 6th | $(-X_2, -Y_2)$ | Use coordinates of pads in 2nd Octant, and multiply both x-coordinate and y-coordinate by −1 |
| 7th | $(X_2, -Y_2)$ | Use coordinates of pads in 2nd Octant, and multiply y-coordinate by −1 |

Also, if the Side Pad Count is odd, not all bond pad coordinates can be mirrored since there will be a bond pad coordinate on a center axis of the die. An example of how an odd Side Pad Count can be managed is as follows. If the pad count on side A of the die is odd, the bond pad centered on the X-axis (i.e. the first bond pad in the 1st octant) is mirrored from the 1st octant to the 5th octant only and not to the 4th and 8th octants. If the pad count on side B of the die is odd, the bond pad centered on the Y-axis (i.e. the first bond pad in the 2nd octant) is mirrored to the 6th octant only and not to the 3rd and 4th octants.

After determining the bond pad positions for each of the eight octants, the pad positions, which at this point are stored in memory, or written to a storage media (e.g. a hard disk), are imported into whatever CAD layout tool is being used for the die design. The pad positions are stored in a format which is readable by the CAD layout tool to facilitate the importation, for example in an ASCII format. The layout tool then uses the imported bond pad coordinates to physically position the bond pads at these coordinates in the appropriate layers of the design. It should be understood that bond pads and bond pad cells occupy more than an area represented by the coordinates. For the purposes of the present discussion, bond pad coordinates refer to the center points of the bond pads. The layout tool uses the imported coordinates and centers bond pads or bond pad cells at these coordinates. In addition to using the stored coordinate information at the die layout and design stage, the coordinates may also be imported into layout tools used for package design and layout.

The foregoing description and illustrations contained herein demonstrate many of the advantages associated with the present invention. In particular, it has been revealed that the described bond pad layout method determines pad center coordinates using an approximated wire angle, thereby optimizing the layout to manufacturing process. Further, the described method compares the geometric attributes of the individual bond pads to the calculated pad coordinates so that pads are positioned within permissible bounds. Another advantage of the present invention is that the method calculates the pad center coordinates iteratively to optimally utilize the available die perimeter to achieve a nearly consistent wire-to-wire spacing without yielding unmanufacturable pad positions. Yet another advantage of the present invention is that the resulting variable pad spacing increases the allowable die placement tolerance (i.e. misalignment during die bond) without adversely impacting the wire bond process. Finally, the present invention may be practiced with minimal information concerning the package design, such that cycle time and the need to compromise the package design to accommodate already existing bond pad constraints is reduced.

Thus it is apparent that there has been provided, in accordance with the invention, a method for determining bond pad positions in a semiconductor die the that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention could be practiced on an entire die side rather than on an octant basis. Furthermore, the present invention could be modified to include information about the second bonds (the wire bond to the lead). In addition, various segments of the program may be modified or omitted. For instance, the Target Wire Angle could be input manually rather than be initially calculated. Also, angles measured in the present invention may be measured instead as distance (e.g. using radians). Furthermore, the sequence of the inventive steps may be reordered for optimization. For example, converging on the last pad coordinate of an octant may be accomplished by adjusting the Baseline Pad Pitch first, then converging on the Target Wire Angle by adjusting the Focal Point. As a further variation, the present invention could be made to be interactive with a CAD program or actually reside within the CAD program. Moreover, the present invention is not restricted to a particular programming language. Languages including BASIC, FORTRAN, APL, PASCAL, COBOL, PL1, C, C++, LISP, SMALLTALK, MODULA-2, ADA, ASSEMBLY, and the like are all suitable for practicing the present invention.

What is claimed is:

1. A method for positioning bond pads along an edge of a semiconductor die in a semiconductor die layout, the method comprising the steps of:

setting a baseline pad pitch to a first value, a cell width to a second value, and a focal point to a third value;

setting a first pad position equal to a first pad value;

determining a first angle between a first line through a center of the first pad position and the focal point and a second line through a center of the semiconductor die and normal to the edge;

determining a pad spacing increment value equal to the first value divided by a cosine of the first angle;

setting a second pad position equal to a second pad value, wherein the second pad value equals one of:

a) the first pad value plus the second value; and b) the first pad value plus the pad spacing increment value;

whichever is greater; and using the first and second pad values to respectively position a first bond pad and a second bond pad in the semiconductor die layout.

2. The method of claim 1 further comprising the steps of:

setting a target wire angle to a fourth value;

determining a second angle between a third line through a center of the second pad position and the focal point and the second line;

defining a first range surrounding the fourth value; and if the second angle falls outside the first range, then performing the steps of: resetting the focal point to a fifth value; and repeating the steps of determining an angle, determining a pad spacing increment, setting a second pad position, and using the first and second pad values;

else determining that the second angle falls within the first range.

3. The method of claim 2 wherein the step of resetting the focal point comprises resetting the focal point to a fifth value equal to the third value divided by a ratio of the fourth value and second angle.

4. The method of claim 2 wherein the semiconductor die has a die length and a die width, and wherein the fourth value equals an arc tangent of a ratio of the die length to the die width.

5. The method of claim 2, further comprising the steps of:

setting a maximum pad position equal to a sixth value;

defining a second range surrounding the sixth value; and after the step of setting a second pad position, if the second pad value falls outside the second range, then performing the steps of:

resetting the baseline pad pitch to a seventh value; and repeating the steps of setting a first pad position, determining a first angle, determining a pad spacing increment, setting a second pad position, and using the first and second pad values;

else determining that the second pad value falls within the second range.

6. The method of claim 5 wherein the step of resetting the baseline pad pitch comprises resetting the baseline pad pitch to a seventh value, wherein the seventh value equals the first value multiplied by a ratio of the fifth value to the second pad value.

7. The method of claim 5 wherein the first value is equal to the sixth value divided by a pad count.

8. The method of claim 1, further comprising the steps of:

setting a maximum pad position equal to a fourth value;

defining a range surrounding the fourth value; and after the step of setting a second pad position, if the second pad value falls outside the range, then performing the steps of:

resetting the baseline pad pitch to a fifth value; and repeating the steps of setting a first pad position, determining a first angle, determining a pad spacing increment, setting a second pad position, and using the first and second pad values;

else determining that the second pad value falls within the range.

9. The method of claim 8 wherein the step of resetting the baseline pad pitch comprises resetting the baseline pad pitch to a fifth value, wherein the fifth value equals the first value multiplied by a ratio of the fourth value to the second pad value.

10. The method of claim 1 wherein the first bond pad and the second bond pad are positioned in a first octant of the semiconductor die layout and wherein positions of the first bond pad and the second bond pad are used to position additional bond pads in at least one other octant of the semiconductor die layout.

11. In a data processing system having a central processing unit and memory, a method for positioning bond pads along an edge of a semiconductor die in a semiconductor die layout, the method comprising the steps of:

receiving input values from an external source which identify a pad count, a die width, a die length, and a furthest pad position;

setting a baseline pad pitch equal to an initial baseline pad pitch value;

setting a target wire angle equal to an initial target wire angle value;

setting a focal point to an initial focal point value;

determining whether the pad count is odd or even;

setting an Ith pad position for an Ith pad to a first initial value if the pad count is odd, else setting the Ith pad position to a second initial value, wherein I is a positive integer;

storing the Ith pad position in memory;

determining an Ith angle between a first line through the Ith pad position and the focal point and a second line through a center of the semiconductor die and normal to the edge;

determining a pad spacing increment by dividing the baseline pad pitch by a cosine of the Ith angle;

setting an (I+1)th pad position relative to the Ith pad position using the pad spacing increment;

storing the (I+1)th pad position in memory;

indexing I by 1;

repeating the steps of determining an Ith angle, determining a pad spacing increment, setting an (I+1)th pad position, storing the (I+1)th pad position, and indexing, until I is greater than the pad count;

retrieving the Ith pad position through an (I−1)th pad position from memory; and using the Ith pad position through the (I−1)th pad position retrieved from memory to position bond pads along the edge of the semiconductor die in the semiconductor die layout.

12. The method of claim 11 wherein the step of receiving input values comprises receiving input values which identify a cell width, and wherein the step of setting the (I+1)th pad position comprises setting the (I+1)th pad position to one of:

a) the Ith pad position plus the cell width; and b) the Ith pad position plus the pad spacing increment; whichever is greater.

13. The method of claim 11 wherein the step of setting a target wire angle comprises setting a target wire angle equal to an initial target wire angle value equal to an arc tangent of a ratio of the die length to the die width.

14. The method of claim 11 further comprising the step of defining a range surrounding the target wire angle, and wherein if, after the step of repeating, an (I−1)th angle is outside the range, then further comprising the steps of:

resetting the focal point by changing the initial focal point value to equal the initial focal point value divided by a ratio of the target wire angle to the (I−1)th angle; and repeating the steps of setting an Ith pad position, storing the Ith pad position, determining an Ith angle, determining a pad spacing increment, setting an (I+1)th pad position, storing the (I+1)th pad position, and indexing, until the (I−1)th angle falls within the range;

else determining that the (I−1)th angle falls within the range.

15. The method of claim 11 further comprising the step of defining a range surrounding the furthest pad position, and wherein, if, after the step of repeating, the (I−1)th pad position is outside the range, then further comprising the steps of:

resetting the baseline pad pitch to equal a product of the initial baseline pad pitch value and a ratio of the furthest pad position to the (I−1)th pad position; and repeating the steps of setting an Ith pad position, storing the Ith pad position, determining an Ith angle, determining a pad spacing increment, setting an (I+1)th pad position, storing the (I+1)th pad position, and indexing, until the (I−1)th pad position falls within the range;

else determining that the (I−1)th pad position falls within the range.

16. The method of claim 11 wherein the step of using the Ith pad position through the (I−1)th pad position comprises using the Ith pad position through the (I−1)th pad position to position bond pads along the edge of the semiconductor die in a first octant of the semiconductor die layout, and further comprising the step of using the Ith pad position through the (I−1)th pad position to position bond pads in at least one other octant of the semiconductor die layout.

17. In a data processing system having a central processing unit and memory, a method for positioning bond pads along an edge of a semiconductor die in a semiconductor die layout, the method comprising the steps of:

a) receiving input values from an external source which identify a pad count, a die width, a die length, a cell width, and a furthest pad position;

b) setting a baseline pad pitch equal to an initial baseline pad pitch value;

c) setting a target wire angle equal to an initial target wire angle value;

d) defining a first range surrounding the target wire angle;

e) defining a second range surrounding the furthest pad position;

setting a focal point to an initial focal point value;

g) determining whether the pad count is odd or even;

h) setting an Ith pad position for an Ith pad to a first initial value if the pad count is odd else setting the Ith pad position to a second initial value, wherein I is a positive integer;

i) storing the Ith pad position in memory;

j) determining an Ith angle between a first line through the Ith pad position and the focal point and a second line through a center of the semiconductor die and normal to the edge;

k) determining a pad spacing increment by dividing the baseline pad pitch by a cosine of the Ith angle;

l) setting an (I+1)th pad position relative to the Ith pad position using the pad spacing increment;

m) storing the (I+1)th pad position in memory;

n) indexing I by 1;

o) repeating step j) through step n) until I is greater than the pad count;

p) if an (I−1)th angle falls outside the first range, then resetting the focal point and repeating step h) through step p) until the (I−1)th angle falls within the first range, else determining that the (I−1)th angle falls within the first range;

q) if the (I−1)th pad position falls outside the second range, then resetting the baseline pad pitch and repeating step h) through step q) until the (I−1)th pad position falls within the second range, else determining that the (I−1)th pad position falls within the second range;

r) retrieving the Ith pad position through the (I−1)th pad position from memory; and s) using the Ith pad position through the (I−1)th pad position retrieved from memory to position bond pads along the edge of the semiconductor die in the semiconductor die layout.

18. The method of claim 17 wherein the step of setting an Ith pad position comprises setting an Ith pad position for an Ith pad to a zero-reference coordinate if the pad count is odd, else setting the Ith pad position to a coordinate corresponding to one half of one of:

a) the cell width; and b) the baseline pad pitch;

whichever is greater.

19. The method of claim 17 wherein the step of receiving input values comprises receiving input values which identify an octant pad count.

20. The method of claim 19 wherein the step of setting a baseline pad pitch comprises setting the baseline pad pitch equal to an initial baseline pad pitch value which equals the furthest pad position divided by the octant pad count.

21. The method of claim 17 wherein the step of setting a focal point comprises setting the focal point to an initial focal point value which is equivalent to the furthest pad position.

22. The method of claim 17 wherein step p) comprises resetting the focal point to equal the initial focal point value divided by a ratio of the target wire angle to the (I−1)th angle, 23. The method of claim 17 wherein step q) comprises resetting the baseline pad pitch to equal a product of the initial baseline pad pitch value and a ratio of the furthest pad position to the (I−1)th pad position.

\* \* \* \* \*